United States Patent
Åstrand et al.

(10) Patent No.: US 7,749,594 B2
(45) Date of Patent: Jul. 6, 2010

(54) CUTTING TOOL WITH WEAR RESISTANT COATING AND METHOD OF MAKING THE SAME

(75) Inventors: Maria Åstrand, Sollentuna (SE); Torbjörn Selinder, Stockholm (SE); Mats Sjöstrand, Kista (SE)

(73) Assignee: Sandvik Intellectual Property AB, Sandviken (SE)

( * ) Notice: Subject to any disclaimer, the term of this patent is extended or adjusted under 35 U.S.C. 154(b) by 530 days.

(21) Appl. No.: 10/579,333

(22) PCT Filed: Sep. 9, 2005

(86) PCT No.: PCT/SE2005/001310

§ 371 (c)(1), (2), (4) Date: Mar. 19, 2007

(87) PCT Pub. No.: WO2006/041366

PCT Pub. Date: Apr. 20, 2006

(65) Prior Publication Data

US 2007/0275179 A1 Nov. 29, 2007

(30) Foreign Application Priority Data

Sep. 10, 2004 (SE) .................................. 04021/80

(51) Int. Cl.
*B32B 9/00* (2006.01)
*C23C 14/06* (2006.01)

(52) U.S. Cl. ........................... 428/216; 51/307; 51/309; 428/336; 428/697; 428/698; 428/699; 204/192.1; 204/192.12; 204/192.15; 204/192.16

(58) Field of Classification Search .................. 51/307, 51/309; 428/216, 336, 697, 698, 699; 204/192.1, 204/192.12, 192.15, 192.16
See application file for complete search history.

(56) References Cited

U.S. PATENT DOCUMENTS 5,503,912 A    4/1996    Setoyama et al.

(Continued)

FOREIGN PATENT DOCUMENTS

| DE | 103 14 932 | 11/2003 |
|----|-----------|---------|
| EP | 0 592 986 | 7/1998 |
| EP | 0 885 984 B1 | 12/1998 |
| EP | 1 260 603 | 11/2002 |
| JP | 8-209333 | 8/1996 |

OTHER PUBLICATIONS

Lugscheider et al "Deposition of arc TiAlN coatings with pulsed bias" Surface & Coating Technology 76-77 (1995) p. 700-705.*

(Continued)

*Primary Examiner*—Archene Turner
(74) *Attorney, Agent, or Firm*—Drinker Biddle & Reath LLP

(57) ABSTRACT

The present invention relates to a cutting tool comprising a substrate and, a wear resistant coating, said wear resistant coating is composed of one or more layers of refractory compounds of which at least one layer consists of a multilayered MX/LX/MX/LX laminar structure where the alternating layers MX and LX are carbides or nitrides with the elements M and L selected from the group consisting of Ti, Nb, Hf, V, Ta, Mo, Zr, Cr, Al, Si or W and mixtures thereof, wherein the sequence of individual layer thicknesses has no repeat period but essentially aperiodic throughout the entire multilayered structure, and where the individual MX and LX layer thickness is larger than 0.1 ran but the sum of any 10 consecutive layers in the structure is smaller than 300 nm, and the total thickness of said multilayered structure is larger than 0.5 µm but smaller than 20 µm, deposited by PVD-technique, where at least one of MX or LX are electrically isolating, and a method of making such a cutting tool.

17 Claims, 3 Drawing Sheets

U.S. PATENT DOCUMENTS

Figure 1:
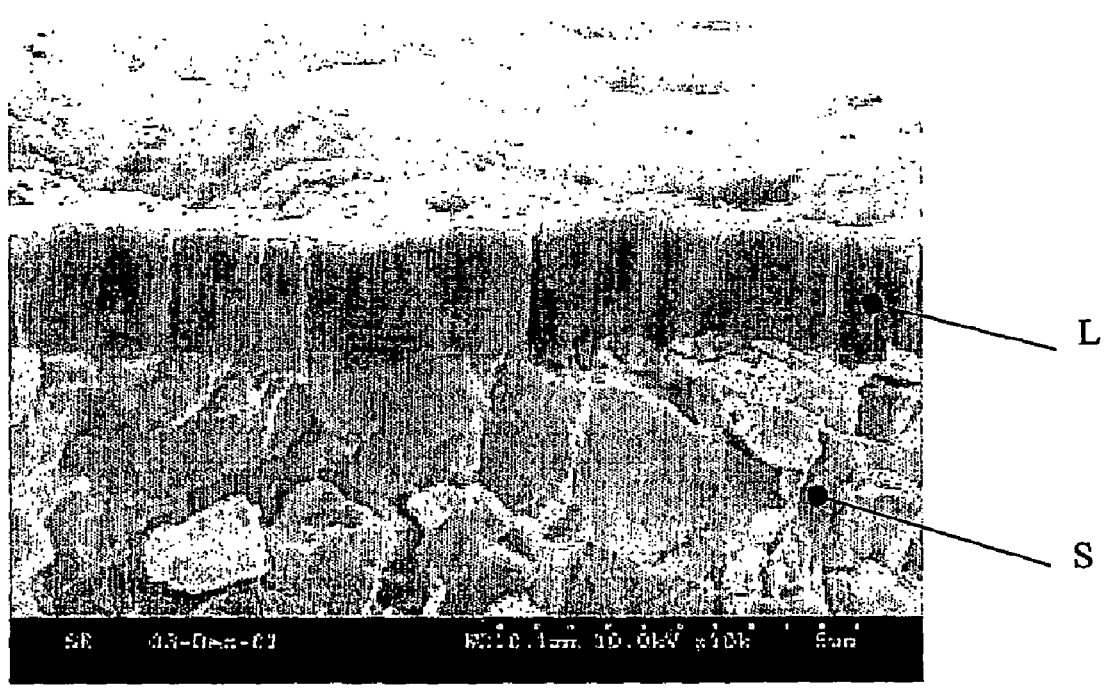

| | | | |
|---|---|---|---|
| 5,700,551 A | * | 12/1997 | Kukino et al. ............... 51/309 |
| 6,077,596 A | * | 6/2000 | Hashimoto et al. .......... 428/699 |
| 6,103,357 A | | 8/2000 | Selinder et al. |
| 6,309,738 B1 | * | 10/2001 | Sakurai ...................... 428/698 |
| 6,326,093 B1 | * | 12/2001 | Lindholm et al. ........... 428/699 |
| 6,620,299 B1 | | 9/2003 | Fietzke et al. |
| 6,855,405 B2 | * | 2/2005 | Okada et al. ................ 428/336 |
| 6,884,499 B2 | * | 4/2005 | Penich et al. ............... 428/216 |
| 2003/0108752 A1 | | 6/2003 | König et al. |

OTHER PUBLICATIONS

Kelly et al "Novel engineering coatings produced by closed field unbalanced magnetron sputtering" Materials & Design vol. 17, No. 4, p. 215-219, 1997.*

Hsieh et al "Deposition and characterization of TiAlN and multi-layered TiN/TiAlN coatings using unbalanced magnetron sputtering" Surface and Coatings Technology 108-109 (1998) p. 132-137.*

Supplementary Partial European Search Report dated Feb. 23, 2009 issued in European Application No. 05777956.

* cited by examiner

CUTTING TOOL WITH WEAR RESISTANT COATING AND METHOD OF MAKING THE SAME

This application is a §371 National Stage Application of PCT International Application No. PCT/SE2005/001310 filed Sep. 9, 2005. This application also claims priority under 35 U.S.C. §119 and/or §365 to Swedish Application No. 0402180-4, filed Sep. 10, 2004.

The present invention relates to a metal cutting tool comprising a substrate and a wear resistant coating including a multilayered structure, and a method comprising a PVD Bipolar Pulsed Dual Magnetron Sputtering technique for producing such a tool.

Modern high productivity chip forming machining of metals requires reliable tools with high wear resistance, good toughness properties and excellent resistance to plastic deformation.

This has so far been achieved by applying a suitable coating to the surface of a tool substrate. As a result, the tool may be used at considerably higher cutting speed and feed. The coating is preferably hard, wear resistant and stable at high temperatures. The tool substrate is generally in the shape of an insert clamped in a tool holder, but can also be in the form of a solid drill or a milling cutter.

Since the mid 1980:s Physical Vapor Deposition (PVD) technology has been developed to the point where not only stable coating compounds like TiN and Ti(C,N) may be grown, but also e.g. a meta-stable TiN/AlN/TiN/AlN structure, which in itself offers unique properties like high hardness, high oxidation resistance and high hot hardness.

PVD methods for depositing multilayered MX/LX/MX/LX structures, where the alternating layers MX and LX are carbides or nitrides with the elements M and L selected from the group consisting of Ti, Nb, Hf, V, Ta, Mo, Zr, Cr, Al, Si and W, comprise vacuum technologies like arc evaporation or magnetron sputtering. Evaporation of metal from targets is accomplished by electrical arc or ion bombardment in a reactive gas containing nitrogen or carbon. Very often the targets have the same metal composition as the final layer. For a multilayer arc coating, having a periodic and constant sublayer thickness throughout the coating, the average composition will depend on the compositions of the two targets and weighted with the individual sublayer thickness as measured in the direction of the layer thickness/growth direction.

Magnetron sputtering yields layers with significantly lower number of surface defects than arc evaporation, but there arise problems when a material like AlN is deposited, inasmuch the coating is an insulator. These problems are often less pronounced when using arc evaporation technology. Magnetron sputtered multilayers are usually comprising individual sublayer coatings that are conducting. There is a problem of using elemental Al targets since insulating AlN will form at the surface. The average coating composition is defined by the relative evaporation rates from the respective target and the composition of these, which compositions set the limits for the obtained coating composition.

It is known from JP-A-08-209333 that the hardness and oxidation temperature of the TiAlN layer continue to improve when the Al content increases beyond 56 at-%. It is also disclosed that as the Al composition is increased above a critical number, approximately above 75 at-%, the resulting layer again becomes soft due to formation of hexagonal AlN. EP-A-592986 discloses that by depositing a layer sequence of periodic repetitions of cubic TiN and AlN with sufficiently small repetition period, even pure AlN may be stabilized in its cubic form rendering the coating extraordinary good properties.

U.S. Pat. No. 6,103,357 discloses a coating comprising a multilayered structure of refractory compounds in polycrystalline, non-repetitive form, MX/LX/MX/LX where the alternating layers MX and LX are metal nitrides or carbides with the metal elements M and L selected from Ti, Nb, Hf, V, Ta, Mo, Zr, Cr, Al and W.

It is an object of the present invention to provide a cutting tool for metal machining, comprising a substrate and a refractory coating comprising a multi-layered structure of alternating nitride or carbide layers or mixtures thereof, of which at least one is electrically isolating.

It is a further object of the present invention to provide a method for producing a cutting tool comprising depositing a refractory multilayer consisting of nitride or carbide layers or mixtures thereof, of which at least one is electrically isolating.

Figure 2:
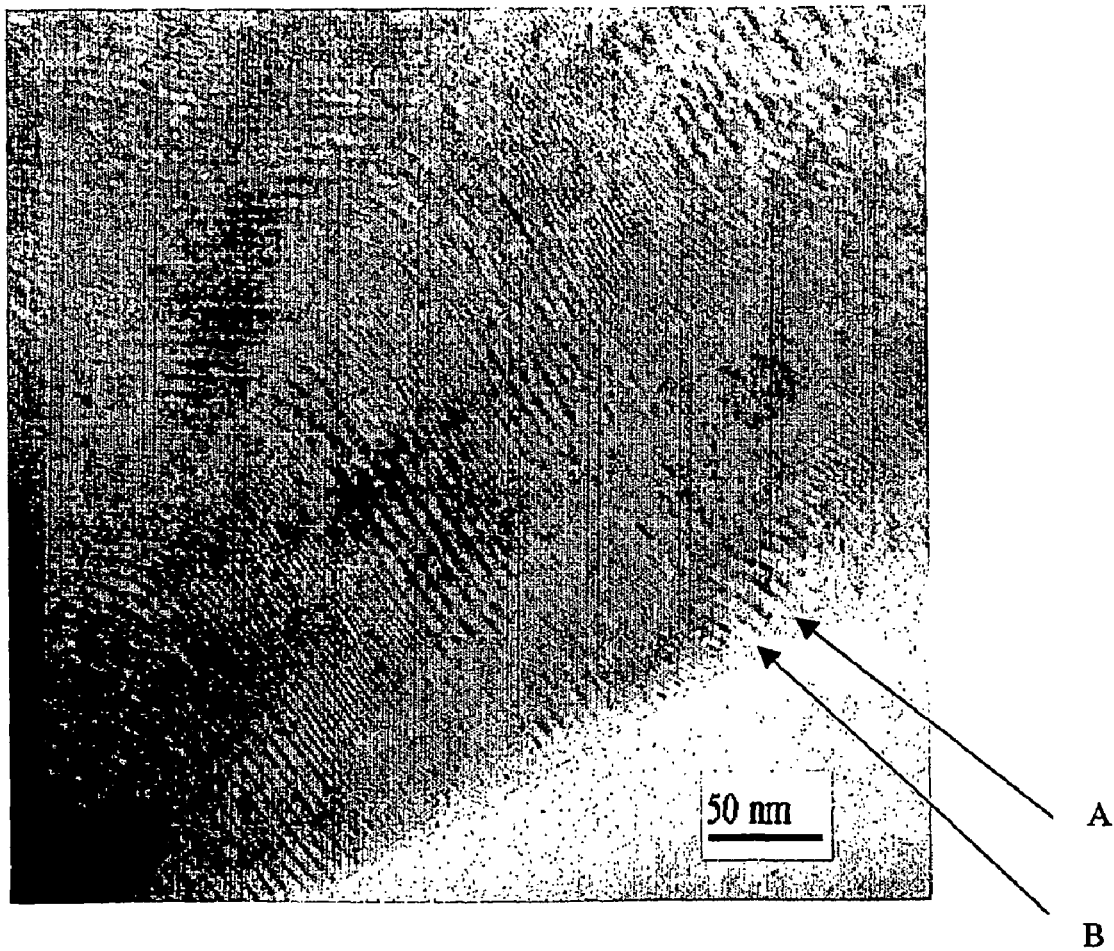

FIG. 1 shows a Transmission Electron Microscope micrograph of an exemplary refractory coating according to the present invention in which
A)=TiN and
B)=AlN FIG. 2 shows a SEM-image of an exemplary TiN/AlN/TiN/AlN-multilayer according to the invention in which
s)=substrate and
L)=multilayer.

Figure 3:
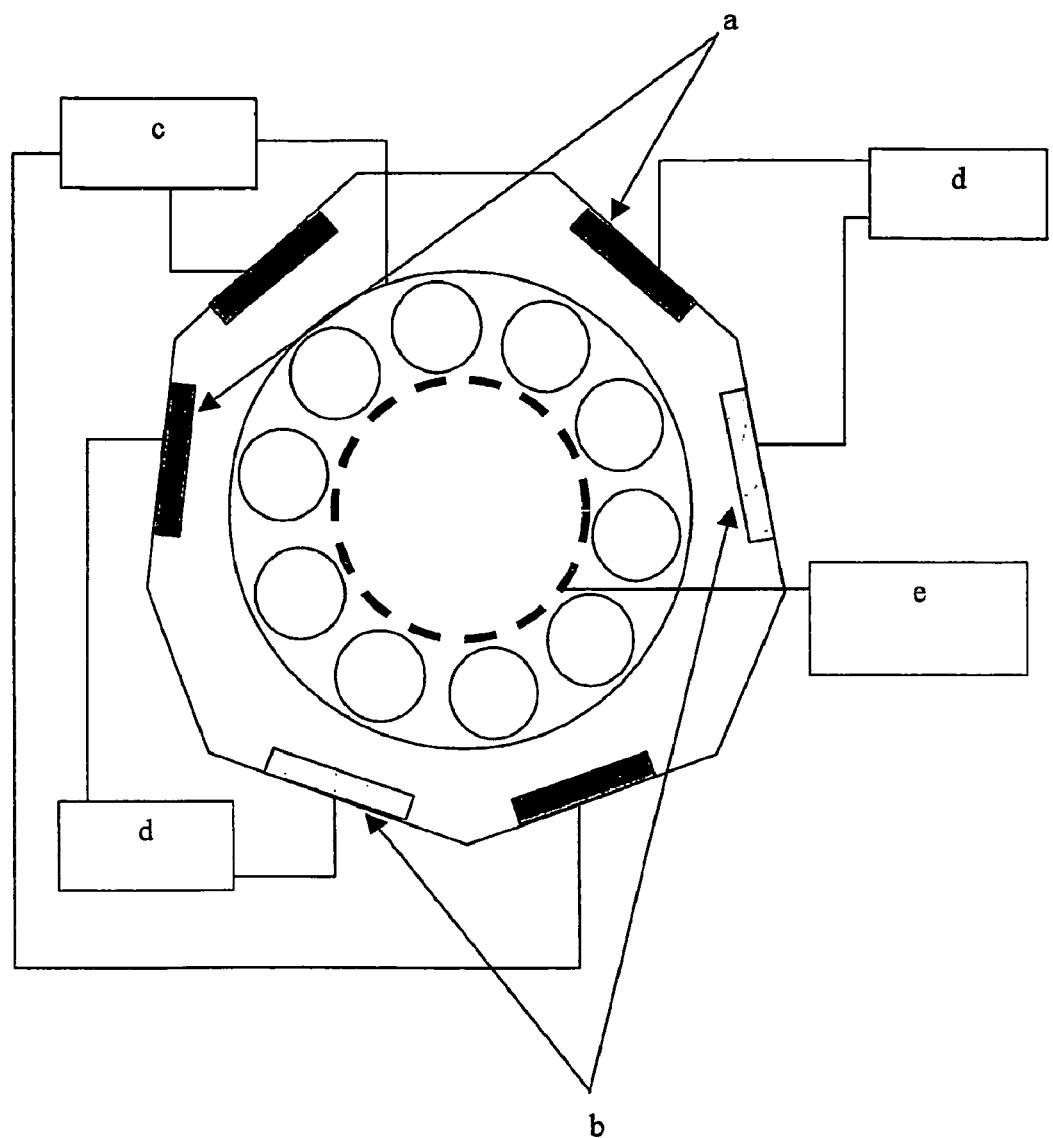

FIG. 3 shows schematically an exemplary target configuration of the BPDMS equipment according to the present invention in which
a)=Titanium target
b)=Aluminum target
c)=Etching/bias supply
d)=Sputtering supply
e)=Heater supply- According to the present invention there is provided a cutting tool for metal machining such as turning, milling and drilling comprising a substrate of e.g. cermet, ceramic, cemented carbide or cubic boron nitride and onto which a hard and wear resistant refractory coating is deposited by PVD technique. The wear resistant coating is composed of one or more layers of refractory compounds of which at least one layer consists of a multilayered MX/LX/MX/LX laminar structure where the alternating layers MX and LX are carbides or nitrides with the elements M and L selected from the group consisting of Ti, Nb, Hf, V, Ta, Mo, Zr, Cr, Al, Si or W and mixtures thereof deposited by PVD-technique, of which at least one of MX or LX are electrically isolating, and that the other layer(s), if any at all, comprise(s) wear resistant nitrides, carbides, oxides and/or carbonitrides as known in the art. The sequence of individual MX and LX layers have thicknesses that are aperiodic throughout the entire multilayer structure. Furthermore, the minimum individual layer thickness is larger than 0.1 nm but the sum of any 10 consecutive layers in the structure is smaller than 300 nm. The thickness of one individual layer does not depend on the thickness of an individual layer immediately beneath nor does it bear any relation to an individual layer above the said one individual layer. Hence, the aperiodic multilayers of the present invention do not have any repeat period. The total thickness of the multilayer is 0.5 to 20 μm, preferably 1 to 10 μm, most preferably 2 to 6 μm.

In one exemplary embodiment of the present invention the multilayered structure has a content gradient in the elements M and L, due to a shift in the relation of the average MX and LX layer thicknesses throughout the multilayer. The average M-content may e.g. be close to zero percent in the innermost part of the multilayer, i.e., the average MX layer thickness is close to zero, hence the average L-content being close to 100 percent. The average M-content may increase to a content near 100 percent towards the outermost part of the multilayer due to a gradually increased average MX layer thickness towards the outermost part of the multilayer.

In one exemplary embodiment of the invention the multilayer has the structure TiN/AlN/TiN/AlN/ . . . , which when written in the form $Ti_{i-x}Al_xN$, has an average Al-content $0.10<x<0.85$ and a nitrogen content of about 50 at-%. The exemplary multilayer has further an intensity ratio for diffraction peak [200] of $I200/(I111+I200+I220)>0.33$, or intensity ratio for diffraction peak [111] of $Im/(I111+I200+I220)>0.33$, or a mixture thereof, with both $I200/(I111+I200+I220)>0.33$ and $Im/(I111+I200+I220)>0.33$, as determined by using XRD with Cu $K_\alpha$ radiation and the intensity ratios calculated as $Ihki/(I111+I200+I220)$. The hardness of said multilayer is in the range 23 to 32 GPa.

In another exemplary embodiment of the above described TiN/AlN/TiN/AlN/... structured multilayer, the multilayer is XRD amorphous.

In a further exemplary embodiment of the above described TiN/AlN/TiN/AlN/ . . . structured multilayer, particularly suitable for depositing an aluminumoxide layer onto, the multilayer has an Al content gradient such that the average Al content increases from the innermost part of the multilayer towards the outermost part of the multilayer.

In further exemplary embodiment of the above described TiN/AlN/TiN/AlN/ . . . structured multilayer, the Al-content is $0.10<x<0.30$, resulting in a cutting tool particularly useful in applications having high demands on abrasive wear resistance due to very high hardness of the multilayer.

In a further exemplary embodiment of the above described TiN/AlN/TiN/AlN/ . . . structured multilayer, the Al-content is $0.40<x<0.55$, resulting in a versatile cutting tool combining high hardness and high temperature properties.

In a further exemplary embodiment of the above described TiN/AlN/TiN/AlN/ . . . structured multilayer, the Al-content is $0.60<x<0.80$, resulting in cutting tool with particularly high resistance against crater wear.

According to the present invention there is provided a method for manufacturing a metal cutting tool comprising depositing a hard and wear resistant refractory coating comprising compounds of which at least one layer consists of a multilayered MX/LX/MX/LX laminar structure where the alternating layers MX and LX are carbides or nitrides with the elements M and L selected from the group consisting of Ti, Nb, Hf, V, Ta, Mo, Zr, Cr, Al, Si or W and mixtures thereof, of which at least one of MX or LX are electrically isolating, and that the other layer(s), if any at all, comprise(s) wear resistant nitrides, carbides, oxides and/or carbonitrides as known in the art, onto a substrate of e.g. cermet, ceramic, cemented carbide or cubic boron nitride by PVD Bipolar Pulsed Dual Magnetron Sputtering (BPDMS) technique. In the BPDMS process magnetron pairs are used comprising either one M element target and one L element target using preferably two magnetron pairs, or using magnetron pairs with two targets of the same element, arranged so that one target in the magnetron pair acts as anode and the other target acts as cathode and vice versa. A voltage of 400 to 1000 V is applied to each bipolar switch and the supply power is limited to $2\times10$ up to $2\times70$ kW. The base pressure prior to deposition should be <2 mPa and the Ar sputtering gas pressure is in the range 0.1 to 1 Pa. The deposition process is performed at substrate temperatures between 300 to 700° C. Preferably a 20 to 100 V bipolar pulsed bias; bias is known to have effect on the intensity ratio of the coating and it is hence possible to achieve different intensity ratios by choosing different bias values; and a current of 4 to 30 A is applied to the substrates using the wall as counter electrode. Threefold substrate rotation is employed in order to ensure homogeneous coating deposition. The sputtering pulse times on the M ($t_M$) and L ($t_L$) targets are set in the range from 2 to 100 μs and the pulse off times, (toFF), between the M and L sputtering pulses in the range 2 to 10 μs. The reactive gas such as $N_2$ or methane or other nitrogen or carbon containing gases, is let in through a common inlet and the reactive gas pressure is preferably in the range 0.01 to 0.25 Pa.

By varying the reactive gas pressure it is possible to shift the sputtering power between the M an L targets hence changing the current relation between the targets and thereby varying the multilayer composition, i.e., varying the average MX and LX layer thicknesses, respectively.

In the deposition process it is also possible to vary the multilayer composition, i.e., vary the average MX and LX layer thicknesses, respectively, by varying the sputtering pulse times in the applied pulse train, defined as $t_M+t_L+2Xt_{oF}F-$

EXAMPLE 1

A TiN/AlN/TiN/AlN/ . . . multilayer, denoted $Ti_{l-x}Al_xN$, was deposited on a cemented carbide substrate using BPDMS using two magnetron pairs, each comprising of one Al and one Ti target, arranged so that Al acted as anode when Ti was cathode and vice versa. A voltage of 900 V was applied to each bipolar switch and the supply power was limited to $2\times35$ kW. The base pressure prior to deposition was <2 mPa and the Ar sputtering gas pressure was 0.4 Pa. The coatings that were deposited are presented together with characteristic process parameters in Table I below. All coatings were deposited at a substrate temperature of 500° C. A constant reactive gas pressure was maintained using pressure feed-back control. A 40 V bipolar pulsed bias and a current of about 15 A was applied to the substrates using the wall as counter electrode. Parameters that were varied were sputtering pulse times on the Ti ($t_{Ti}$) and the Al ($t_A$i) targets, respectively, as well as $N_2$ pressure. The $N_2$ was let in through a common diffuse inlet. The pulse-off times between the Ti and Al sputtering pulses were kept at 5 μs during all experiments and the pulse train is written as $t_{Ai}/t_{Ti}$, e.g. 7/30 μs. The three different pulse conditions studied are 7/30 μs (total pulse train length 47 μs), 12/25 μs (total pulse train length 47 μs) and 10/10 μs (total pulse train length 30 μs). The sputtering currents for the Ti and Al targets were resolved by measuring the branch currents during the respective sputtering pulses. Not only the nitrogen flow but also the individual Ti and Al sputtering currents varied with the set $N_2$ pressure. For the sputtering pulse 7/30 μs it was found that the Al sputtering currents increased from values close to zero at a low pressure, to a magnitude close to that of the Ti sputtering current at high pressure. Threefold substrate rotation was employed in order to ensure homogeneous coating deposition of the cemented carbide cutting tools and the deposition time was set to 120 min.

TABLE I

| Sample | $t_{Al}/t_{Ti}$ [μs] | $p_{tot}$ [Pa] | $p_{N2}$ [Pa] | $\Gamma_{N2}$ [seem] | $I_{Ti}$ [A] | $I_{Al}$ [A] |
|---|---|---|---|---|---|---|
| 7/30_1.2 | 7/30 | 0.52 | 0.12 | 184 | 31 | 26 |
| 12/25_0.5 | 12/25 | 0.45 | 0.05 | 153 | 22 | 10 |
| 12/25_0.7 | 12/25 | 0.47 | 0.07 | 154 | 19 | 18 |

TABLE I-continued

| Sample | $t_{Al}/t_{Ti}$ [µs] | $p_{tot}$ [Pa] | $p_{N2}$ [Pa] | $r_{N2}$ [sccm] | $I_{Ti}$ [A] | $I_{Al}$ [A] |
|---|---|---|---|---|---|---|
| 12/25_0.8 | 12/25 | 0.48 | 0.08 | 166 | 21 | 28 |
| 12/25_0.9 | 12/25 | 0.49 | 0.09 | 158 | 17 | 35 |
| 10/10_0.3 | 10/10 | 0.43 | 0.03 | 71 | 6 | 5 |
| 10/10_0.6 | 10/10 | 0.46 | 0.06 | 108 | 5 | 20 |

All coatings were studied using a Hitachi S-4300 field emission gun scanning electron microscope (FEG-SEM) at 10 kV and a JEOL 2010 transmission electron microscope (TEM) with selected area electron diffraction (SAED) to enable phase analysis. The chemical composition was determined by Electron Probe Micro Analysis (EPMA) using a JEOL JXA-8900R at an acceleration voltage of 10 kV and a 10 nA probe current. Ti and Al were analyzed by their x-ray intensities while the N stoichiometry was estimated by the difference between the coating x-ray intensity and the intensity of a metallic sample. The phase composition was determined using x-ray diffraction with Cu $K_\alpha$ radiation. The intensity ratios were calculated as Ihki/(I111+I200+I220). A CSEM nano hardness tester was used to determine the hardness of the coatings. By using a load of 25 mN the contribution from the substrate was regarded as very small or none for all coatings.

The result of the test is summarized in Table II below.

When comparing coatings deposited using a pulse train of 12/25 µs, it was found that the growth rate was highest for the lowest $N_2$ pressure, 0.05 Pa. This is most likely due to the fact that sputtering at a lower $N_2$ pressure equals sputtering at a more metallic mode. The depositions at 0.07-0.09 Pa were deposited in the reactive regime. Despite the increasing $N_2$ pressure the deposition rates were equal at around 18 nm/min.

For a pulse of 7/30 µs the coating metal composition corresponded to $Ti_0.84Al_0$ is and for a pulse train of 12/25 µs x ranged from 0.36-0.58 and for a pulse train of 10/10 µs x varied between 0.72-0.84. This means that by varying the pulse times in the present range in combination with a variation of the $N_2$ pressure as $0.08p_{Ar} \leq Pnit_{rog}e_n \leq 0.3p_{Ar}/x$ in $Ti_{1-x}Al_xN$ can be controlled in the range 0.16 to 0.84. The nitrogen composition was calculated to around 50 at-%.

Coatings with a low Al content, $x \leq 0.49$, were columnar and the surface were cauliflower-like. A higher Al content, $x \geq 0.58$, resulted in a more glassy structure. The columnar coatings exhibit a bronze-like colour whereas the glassy coatings exhibit a blue or even transparent colour.

From XRD it was found that the intensity ratio changes from [200] type for the coating with lower Al content to [111] type for the coatings with higher Al content.

The invention claimed is:

1. A cutting tool comprising a substrate and a wear resistant coating, said wear resistant coating is composed of one or more layers of refractory compounds of which at least one layer consists of a multilayered MX/LX/MX/LX laminar structure where the alternating layers MX and LX are carbides or nitrides with the elements M and L selected from the group consisting of Ti, Nb, Hf, V, Ta, Mo, Zr, Cr, Al, Si or W and mixtures thereof, wherein the sequence of individual layer thicknesses has no repeat period but is essentially aperiodic throughout the entire multilayered structure, and where the individual MX and LX layer thickness is larger than 0.1 nm but the sum of any 10 consecutive layers in the structure is smaller than 300 nm, and the total thickness of said multilayered structure is larger than 0.5 µm but smaller than 20 µm, deposited by PVD-technique and that the other layer(s), if any at all, comprise(s) wear resistant nitrides, carbides, oxides and/or carbonitrides wherein at least one of MX or LX are electrically isolating and wherein the multilayered structure has a content gradient in the elements M and L.

2. A cutting tool according to claim 1 wherein the alternating layers MX and LX are nitrides.

3. A cutting tool according to claim 1 wherein the multilayer has a composition gradient from the innermost part of the multilayer toward the outermost part of the layer.

4. A cutting tool according to claim 1 wherein an average M-content is close to zero percent in an innermost part of the multilayer and increases to a content close to 100 percent in the outermost part of the multilayer.

5. A cutting tool according to claim 1 wherein M and L in the alternating layers MX and LX are Ti and Al, respectively.

6. A cutting tool according to claim 5 wherein the aluminum content in the multilayer structure, when written in the form $Ti_{1-x}Al_xN$, is $0.10 < x < 0.85$.

7. A cutting tool according to claim 6 wherein the multilayer has an intensity ratio for diffraction peak [200] of $I_{200}/(I_{111}+I_{200}+I_{220}) > 0.33$, or an intensity ratio for diffraction peak [111] of $I_{111}/(I_{111}+I_{200}+I_{220}) > 0.33$, or a mixture thereof, as determined by using XRD with Cu $K_\alpha$ radiation and the intensity ratios calculated as $I_{hkl}/(I_{111}+I_{200}+I_{220})$.

8. A cutting tool according to claim 7 wherein both $I_{200}/(I_{111}+I_{200}+I_{220}) > 0.33$ and $I_{111}/(I_{111}+I_{200}+I_{220}) > 0.33$.

9. A cutting tool according to claim 7 wherein a hardness of said multilayer is in the range 23 to 32 GPa.

10. A cutting tool according to claim 6 wherein the multilayer is XRD amorphous.

11. Method for manufacturing a metal cutting tool comprising depositing a hard and wear resistant refractory coating comprising compounds of which at least one layer consists of an aperiodic multilayered MX/LX/MX/LX laminar structure where the alternating layers MX and LX are carbides or

TABLE II

| Sample | r [nm/min] | tc [µm] | Colour | x in $Ti_{1-x}Al_xN$ | $XRD_{I111/Itot}$* | $XRD_{I200/Itot}$* | $XRD_{I220/Itot}$* | $NH_{25}InN$ [GPa] |
|---|---|---|---|---|---|---|---|---|
| 7/30_1.2 | 12 | 1.4 | Brown-bronze | 0.16 | 0.17 | 0.73 | 0.10 | 31.0 |
| 12/25_0.5 | 23 | 2.8 | Purple-bronze | 0.36 | 0.58 | 0.30 | 0.12 | 23.0 |
| 12/25_0.7 | 18 | 2.1 | Purple-bronze | 0.41 | 0.68 | 0.29 | 0.03 | 30.9 |
| 12/25_0.8 | 18 | 2.1 | Purple-blue | 0.49 | 0.85 | 0.13 | 0.03 | 31.6 |
| 12/25_0.9 | 17 | 2.0 | Blue | 0.58 | —** | —** | —** | 28.7 |
| 10/10_0.3 | 9 | 1.1 | Transparent | 0.72 | —** | —** | —** | 25.6 |
| 10/10_0.6 | 13 | 1.5 | Transparent | 0.84 | —** | —** | —** | 25.2 |

*$I_{tot} = (I_{111} + I_{200} + I_{220})$
**XRD amorphous nitrides with the elements M and L selected from the group consisting of Ti, Nb, Hf, V, Ta, Mo, Zr, Cr, Al, Si and W and mixtures thereof, of which at least one of MX or LX are electrically isolating, and that the other layer(s), if any at all, comprise(s) wear resistant nitrides, carbides, oxides and/or carbonitrides as known in the art, onto a substrate using PVD Bipolar Pulsed Dual Magnetron Sputtering (BPDMS) technique, using magnetron pairs comprising either one M element target and one L element target, or using magnetron pairs with two targets of the same element, arranged so that one target in the magnetron pair acts as anode and the other target acts as cathode and vice versa, applying a voltage of 400 to 1000 V to each bipolar switch and limiting the supply power to 2×10 up to 2×70 kW, using a base pressure prior to deposition <2 mPa and a Ar sputtering gas pressure in the range 0.1 to 1 Pa, substrate temperatures between 300 to 700° C., and using a threefold substrate rotation, setting the sputtering pulse times on the M ($t_m$) and L ($t_L$) targets in the range from 2 to 100 µs and the pulse off times ($t_{OFF}$) between the M and L sputtering pulses in the range 2 to 10 µs, and using a reactive gas pressure between 0.01 to 0.25 Pa.

12. The method according to claim 11 wherein the composition of multilayer is varied by altering the relation between the sputtering pulse times on the M ($t_M$) and L ($t_L$) targets.

13. The method according to claim 11 wherein the composition of multilayer is varied by altering the reactive gas pressure.

14. The method according to claim 13 wherein the presence of reactive gas is varied during the deposition process.

15. The method according to claim 11 wherein a relation between the sputtering pulse times on the M ($t_M$) and L ($t_L$) targets is varied during the deposition process.

16. The method according to claim 11 wherein two magnetron pairs are used.

17. The method according to claim 11 wherein a 20 to 100 V bipolar pulsed bias and a current of 4 to 30 A are applied to the substrates using a wall as a counter electrode.

* * * * *